United States Patent
Voelz

(10) Patent No.: US 7,256,074 B2
(45) Date of Patent: Aug. 14, 2007

(54) METHODS FOR WAFER-LEVEL PACKAGING OF MICROELECTRONIC DEVICES AND MICROELECTRONIC DEVICES FORMED BY SUCH METHODS

(75) Inventor: James L. Voelz, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 10/687,096

(22) Filed: Oct. 15, 2003

(65) Prior Publication Data

US 2005/0085006 A1 Apr. 21, 2005

(51) Int. Cl.
  *H01L 21/00* (2006.01)
(52) U.S. Cl. ..................................... 438/114
(58) Field of Classification Search ............... 257/669;
  438/114, 460, 113, 463, 464, 465
  See application file for complete search history.

(56) References Cited

U.S. PATENT DOCUMENTS

| | | | |
|---|---|---|---|
| 5,518,957 A | 5/1996 | Kim | |
| 5,682,065 A * | 10/1997 | Farnworth et al. | 257/678 |
| 5,851,845 A | 12/1998 | Wood et al. | |
| 5,933,713 A | 8/1999 | Farnworth | |
| 5,946,553 A | 8/1999 | Wood et al. | |
| 6,004,867 A | 12/1999 | Kim et al. | |
| 6,008,070 A | 12/1999 | Farnworth | |
| 6,020,624 A | 2/2000 | Wood et al. | |
| 6,023,094 A * | 2/2000 | Kao et al. | 257/632 |
| 6,072,236 A | 6/2000 | Akram et al. | |
| 6,075,290 A * | 6/2000 | Schaefer et al. | 257/737 |
| 6,124,634 A | 9/2000 | Akram et al. | |
| 6,184,465 B1 | 2/2001 | Corisis | |
| 6,187,615 B1 | 2/2001 | Kim et al. | |
| 6,194,250 B1 | 2/2001 | Melton et al. | |
| 6,228,687 B1 | 5/2001 | Akram et al. | |
| 6,235,552 B1 | 5/2001 | Kwon et al. | |
| 6,271,469 B1 | 8/2001 | Ma et al. | |
| 6,300,782 B1 | 10/2001 | Hembree et al. | |

(Continued)

OTHER PUBLICATIONS

The Dow Chemical Company, "Processing Procedures for Dry-Etch CYCLOTENE Advanced Electronics Resins (Dry-Etch BCB)," 8 pages, Nov. 1997, Midland, MI.
The Dow Chemical Company, "BCB Properties," 1995-2002, 2 pages, retrieved from the Internet on Jan. 8, 2003, <http://www.dow.com/cyclotene/over.htm>.

(Continued)

*Primary Examiner*—Sara Crane
(74) *Attorney, Agent, or Firm*—Perkins Coie LLP

(57) ABSTRACT

Methods for packaging microelectronic devices, microelectronic workpieces having packaged dies, and microelectronic devices are disclosed herein. One aspect of the invention is directed toward a microelectronic workpiece comprising a substrate having a device side and a backside. In one embodiment, the microelectronic workpiece further includes a plurality of dies formed on the device side of the substrate, a dielectric layer over the dies, and a plurality of bond-pads on the dielectric layer. The dies have integrated circuitry and a plurality of bond-pads electrically coupled to the integrated circuitry. The ball-pads are arranged in ball-pad arrays over corresponding dies on the substrate. The microelectronic workpiece of this embodiment further includes a protective layer over the backside of the substrate. The protective layer is formed on the backside of the substrate from a material that is in a flowable state and is then cured to a non-flowable state.

37 Claims, 9 Drawing Sheets

U.S. PATENT DOCUMENTS

| | | | |
|---|---|---|---|
| 6,326,697 B1 | 12/2001 | Farnworth | |
| 6,326,698 B1 | 12/2001 | Akram | |
| 6,368,896 B2 * | 4/2002 | Farnworth et al. | 438/113 |
| 6,407,381 B1 | 6/2002 | Glenn et al. | |
| 6,441,473 B1 | 8/2002 | Deshmukh | |
| 6,462,426 B1 * | 10/2002 | Kelkar et al. | 257/781 |
| 6,503,780 B1 | 1/2003 | Glenn et al. | |
| 6,552,423 B2 | 4/2003 | Song et al. | |
| 6,560,122 B2 * | 5/2003 | Weber | 361/783 |
| 6,635,363 B1 | 10/2003 | Duclos et al. | |
| 6,709,953 B2 * | 3/2004 | Vasquez et al. | 438/460 |
| 6,908,784 B1 * | 6/2005 | Farnworth et al. | 438/106 |
| RE38,789 E | 9/2005 | Kao et al. | |
| 2004/0042190 A1 | 3/2004 | Eng et al. | |

OTHER PUBLICATIONS

The Dow Chemical Company, "Bumping/Redistribution/Wafer Level Packaging (WLP)," 1995-2002, 2 pages, retrieved from the Internet on Jan. 8, 2003, <http://www.dow.com/cyclotene/apps/appl1.htm>.

Lintec Corporation, ADWILL LE5950 Material Safety Data Sheet, 3 pages, Aug. 28, 2001, Tokyo, Japan.

Ablestik Laboratories, RP-695-2E Material Safety Data Sheet, 6 pages, Nov. 6, 2002, Rancho Dominguez, California.

Ablestik Laboratories, RP-695-2E2 Material Safety Data Sheet, 6 pages, Dec. 3, 2002, Rancho Dominguez, California.

Ablestik Laboratories, Experimental Product RP-695-2E, Non-Conductive WBL Film for Die Encapsulation, 2 pages, Nov. 2002, Rancho Dominguez, California.

Ablestik Laboratories, Technical Data Sheet, Experimental Product RP-695-2E, Non-Conductive WBL Film for Die Encapsulation, 2 pages, Dec. 2002, Rancho Dominguez, California.

* cited by examiner

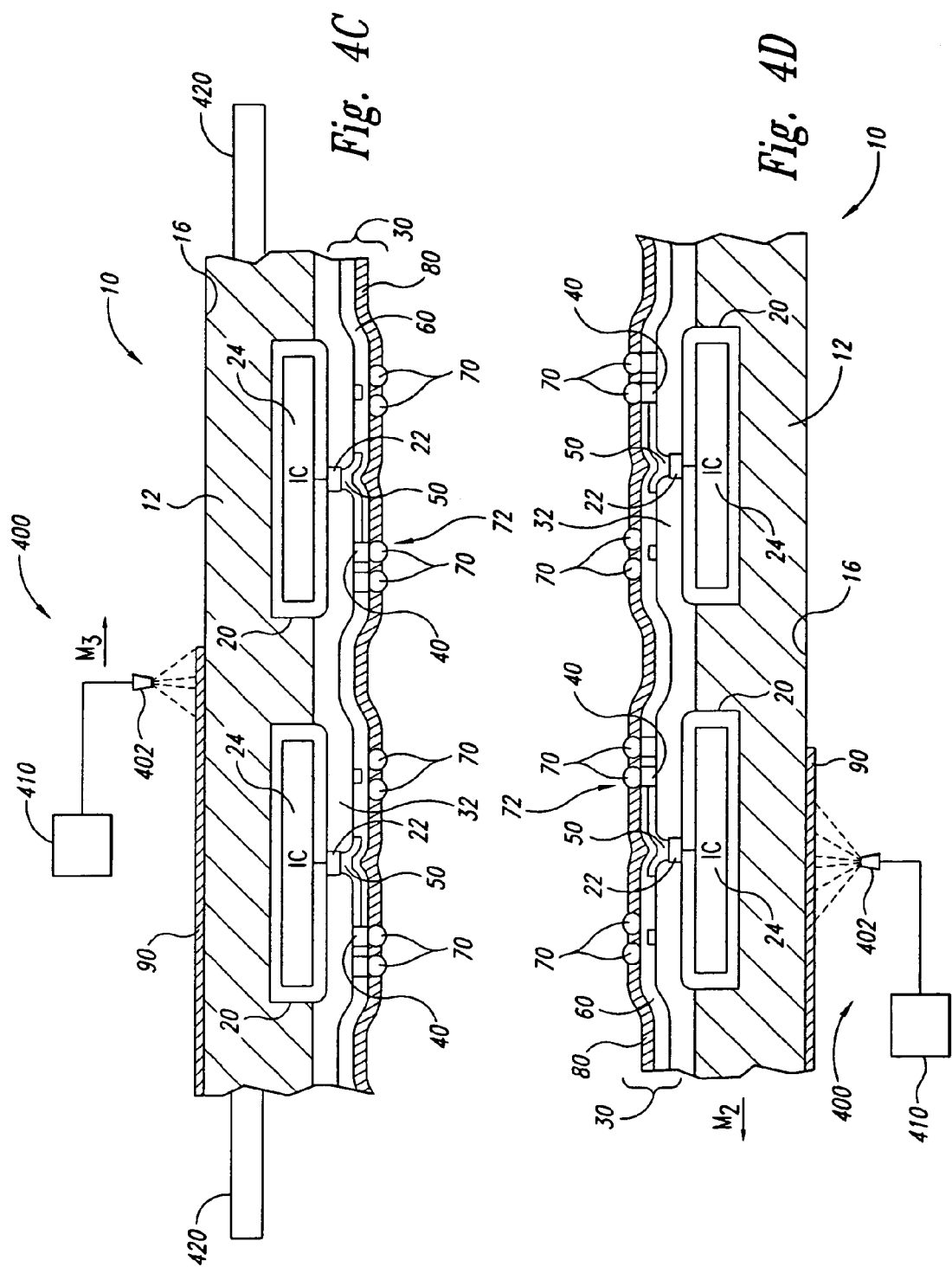

METHODS FOR WAFER-LEVEL PACKAGING OF MICROELECTRONIC DEVICES AND MICROELECTRONIC DEVICES FORMED BY SUCH METHODS

TECHNICAL FIELD

The present invention relates to packaging microelectronic devices and, in particular, methods for packaging such devices at the wafer level and microelectronic devices formed by such methods.

BACKGROUND

Microelectronic devices are used in cell phones, pagers, personal digital assistants, computers, and many other products. A die-level packaged microelectronic device can include a microelectronic die, an interposer substrate or lead frame attached to the die, and a molded casing around the die. The microelectronic die generally has an integrated circuit and a plurality of bond-pads coupled to the integrated circuit. The bond-pads are coupled to terminals on the interposer substrate or lead frame. The interposer substrate can also include ball-pads coupled to the terminals by conductive traces in a dielectric material. An array of solder balls is configured so that each solder ball contacts a corresponding ball-pad to define a "ball-grid" array. Packaged microelectronic devices with ball-grid arrays are generally higher grade packages that have lower profiles and higher pin counts than conventional chip packages that use a lead frame.

Die-level packaged microelectronic devices are typically made by (a) forming a plurality of dies on a semiconductor wafer, (b) cutting the wafer to singulate the dies, (c) attaching individual dies to an individual interposer substrate, (d) wire-bonding the bond-pads to the terminals of the interposer substrate, and (e) encapsulating the dies with a molding compound. Mounting individual dies to individual interposer substrates is time consuming and expensive. Also, as the demand for higher pin counts and smaller packages increases, it becomes more difficult to (a) form robust wire-bonds that can withstand the forces involved in molding processes and (b) accurately form other components of die-level packaged devices. Therefore, packaging processes have become a significant factor in producing semiconductor and other microelectronic devices.

Another process for packaging microelectronic devices is wafer-level packaging. In wafer-level packaging, a plurality of microelectronic dies are formed on a wafer and a redistribution layer is formed over the dies. The redistribution layer includes a dielectric layer and a plurality of conductive lines in the dielectric layer that define ball-pad arrays. Each line has one end connected to a bond-pad on a die and another end with a ball-pad. Each ball-pad array is arranged over a corresponding microelectronic die. After forming the redistribution layer on the wafer, a stenciling machine deposits discrete blocks of solder paste onto the ball-pads of the redistribution layer or balls are attached using ball-attach machines. The solder paste is then reflowed to form solder balls or solder bumps on the ball-pads. After forming the solder balls on the ball-pads, the wafer is cut to singulate the dies.

Wafer-level packaging is a promising development for reducing the cost of manufacturing microelectronic devices. By "prepackaging" the individual dies with the redistribution layer before cutting the wafers to singulate the dies, sophisticated semiconductor processing techniques can be used to form smaller arrays of solder balls. Additionally, wafer-level packaging is an efficient process that simultaneously packages a plurality of dies to reduce costs, increase throughput, and increase performance.

One concern of wafer-level packaged microelectronic devices is that the bare dies may be chipped or damaged in post-packaging handling. To help alleviate this problem, a protective cover can be placed over the backside of each wafer. Currently, this backside cover is a sheet of tape that is applied manually to each individual wafer. This manual application, however, is time-consuming, expensive, and subject to errors (e.g., bubbles). Furthermore, the sheets of tape are expensive.

BRIEF DESCRIPTION OF THE DRAWINGS

FIG. 4C is a schematic side cross-sectional view illustrating a workpiece at another stage of an embodiment of a method in accordance with the invention.

FIG. 4D is a schematic side cross-sectional view illustrating a workpiece at another stage of an embodiment of a method in accordance with the invention.

DETAILED DESCRIPTION

A. Overview

Figure 1A:
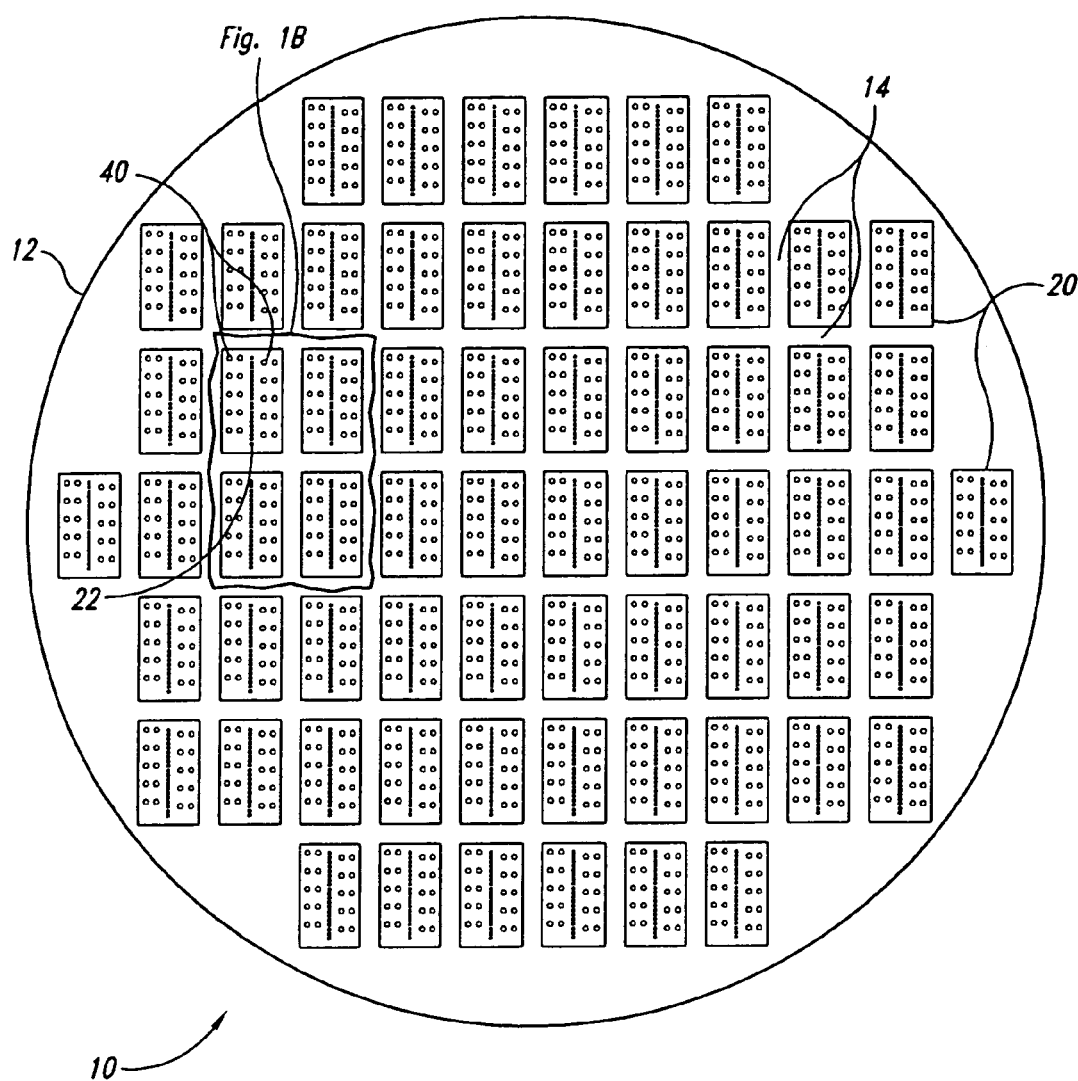
FIG. 1A is a top plan view of a workpiece with a plurality of dies at one stage of manufacturing a microelectronic device in accordance with an embodiment of the invention.

Several aspects of the present invention are directed toward methods for packaging microelectronic devices, microelectronic workpieces having packaged dies, and microelectronic devices. One embodiment of a method for fabricating a microelectronic device comprises fabricating a plurality of dies on an active side of a microelectronic workpiece and constructing a redistribution assembly over the dies on the active side of the workpiece. The dies can include integrated circuitry and bond-pads coupled to the integrated circuitry. The redistribution assembly can be constructed before singulating the workpiece by depositing a dielectric layer over the dies, exposing the bond-pads on the dies, and forming conductive features in the dielectric layer having traces connected to the bond-pads and ball-pads at the end of the traces. The electrical traces couple the ball-pads of one array to the bond-pads of a corresponding die. This method can further include covering a backside of the microelectronic workpiece with a material in a flowable state. The flowable material, for example, can be a polyimide, epoxy-based, or modified silicone material. The flowable material can be applied to the backside of the workpiece using various processes, including stencil printing, spraying, spin coating, and/or a dip bath.

The protective layer can be formed from a material that is flowable at room temperatures. For example, the material can be flowable at a temperature of approximately 25° C. After the flowable material is applied to the backside of the workpiece, the flowable material can be cured to create a protective layer on the backside of the workpiece. For example, the flowable material can be cured to a non-flowable state at a temperature of approximately 30° C.-500° C. In several embodiments, the time for curing the material can vary from 15-150 minutes. In alternate embodiments, rapid thermal processing may be used to cure the flowable material to a non-flowable state.

Another aspect of the invention is directed toward a microelectronic device comprising a substrate having a device side and a backside. A plurality of dies are formed on the device side of the substrate. The dies include integrated circuitry and a plurality of bond-pads electrically coupled to the integrated circuitry. The device further includes a dielectric layer over the dies, ball-pads arranged in ball-pad arrays corresponding to the dies, and traces coupling the bond-pads of the dies to the ball-pads of the corresponding ball-pad arrays. The device further includes a protective layer on the backside of the substrate formed from a flowable material that can be cured to become a durable, fixed coating. Several embodiments of the foregoing methods and microelectronic devices provide a relatively inexpensive backside protective coating that can be applied using automated processes.

The following disclosure describes several embodiments of microelectronic devices, microelectronic workpieces, and methods for manufacturing microelectronic devices and microelectronic workpieces. Many specific details of the invention are described below with reference to semiconductor devices. The term "workpiece," however, is used throughout to include any substrate upon which and/or in which microelectronic devices, micromechanical devices, data storage elements, read/write components, and other features are fabricated. For example, workpieces can be semiconductor wafers (e.g., silicon or gallium arsenide wafers), glass substrates, insulative substrates, and many other types of materials. The workpieces typically have very small, conductive lines, transistors, recesses, and other components that form integrated circuitry. Many components of the integrated circuitry are submicron features with dimensions less than 1.0 μm, such as in the range of a few nanometers to 0.5 μm. Several embodiments in accordance with the invention are set forth in FIGS. 1A-7 and the following text to provide a thorough understanding of particular embodiments of the invention. A person skilled in the art, however, will understand that the invention may have other embodiments that include more or fewer elements than those shown and described with reference to the embodiments of FIGS. 1A-7.

In the Figures, identical reference numbers identify identical or generally similar elements. To facilitate the discussion of any particular element, the most significant digit or digits of any reference number refer to the Figure in which that element is first introduced. For example, element 310 is first introduced and discussed with reference to FIG. 3.

Figure 1B:
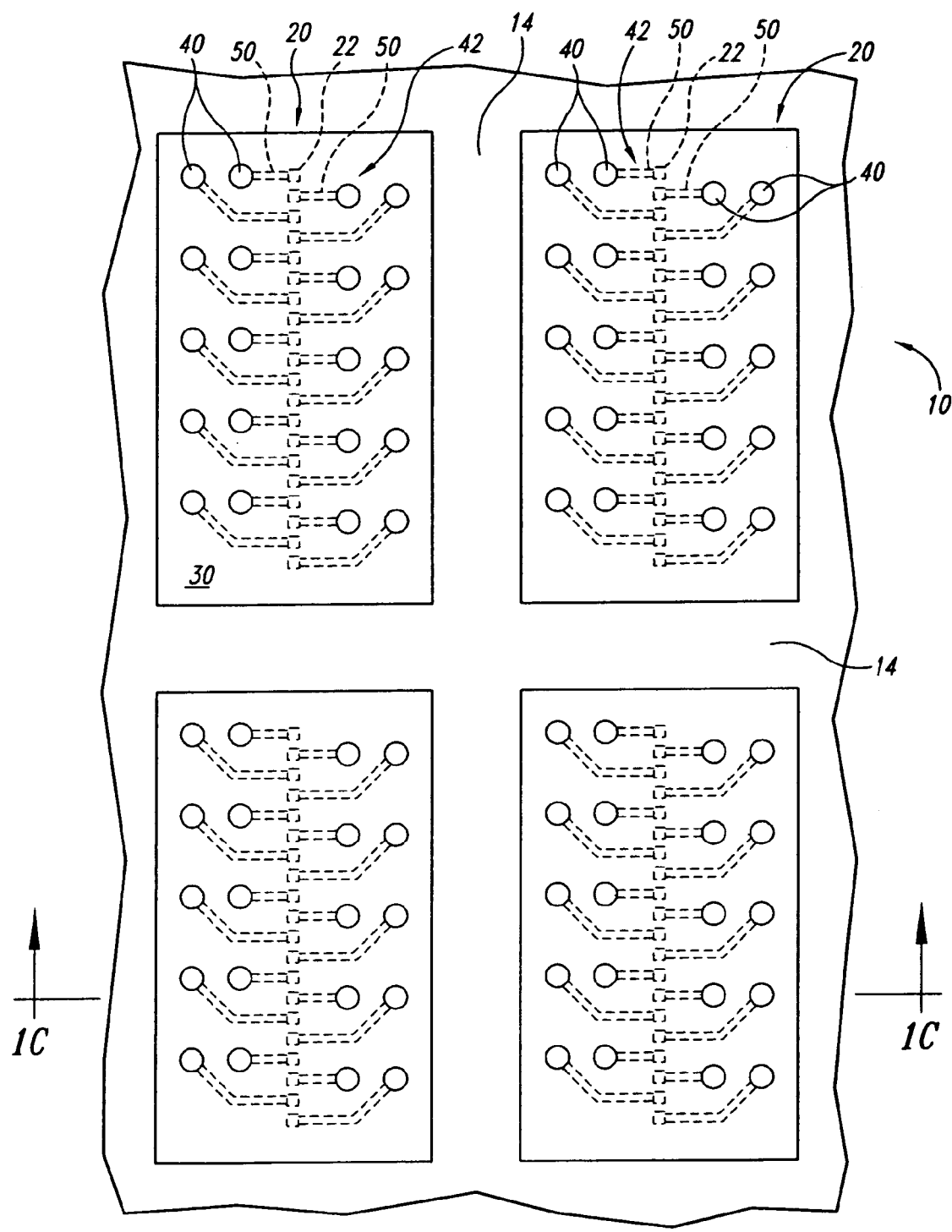
FIG. 1B is a top plan view showing a portion of the microelectronic workpiece of FIG. 1A.

B. Microelectronic Workpieces and Methods for Forming Microelectronic Workpieces FIG. 1A is a top plan view of a microelectronic workpiece 10 and FIG. 1B is a top plan view showing a detailed portion of the microelectronic workpiece 10 of FIG. 1A. FIGS. 1A and 1B, more specifically, illustrate the microelectronic workpiece 10 at one stage of using wafer-level packaging to provide ball-grid arrays for individual dies on the workpiece 10 in accordance with one embodiment of the invention.

The workpiece 10 includes a substrate 12, a plurality of scribe lanes 14, and a plurality microelectronic dies 20. The substrate 12 can include a semiconductive material that is doped or implanted with specific materials to form microelectronic components. Additional dielectric materials, conductive materials, and semiconductive materials can form more components of circuits in stacks of layers on the substrate 12. The scribe lanes 14 separate the dies 20 from each other to provide spaces for cutting the workpiece 10 into individual microelectronic devices. The dies 20 can be memory devices, processors, imaging chips, or other types of devices that include integrated circuitry. Each die 20 includes a plurality of bond-pads 22 (best shown in FIG. 1B) that are coupled to the integrated circuitry in the dies 20. The bond-pads 22 accordingly provide external contacts to provide source voltages, ground voltages, and signals to the integrated circuitry in each die 20. The bond-pads 22, however, are typically so small that they cannot be attached directly to contacts on printed circuit boards or other modules in a cost-effective manner.

Figure 1C:
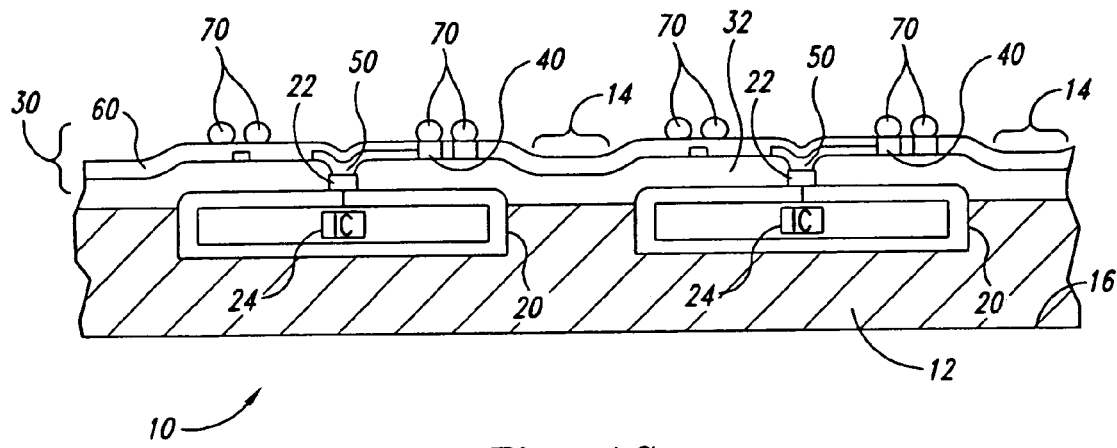
FIG. 1C is a schematic cross-sectional view of the portion of the workpiece of FIG. 1B.

FIG. 1C is a schematic cross-sectional view of the workpiece 10 taken along line 1C-1C of FIG. 1B. Referring to FIG. 1C, the bond-pads 22 are coupled to the integrated circuitry 24 in each individual die 20. The workpiece 10 also includes a redistribution layer 30 having a first dielectric layer 32 over the dies 20. Referring to FIGS. 1B and 1C together, the redistribution layer 30 also includes a plurality of ball-pads 40 arranged in ball-pad arrays 42 and traces 50 coupling the ball-pads 40 to the bond-pads 22. The ball-pad arrays 42 are positioned over the dies 20 such that each ball-pad array 42 is associated with a corresponding die 20. The ball-pads 40 in a particular ball-pad array 42 are accordingly coupled to the bond-pads 22 of a corresponding die 20. Referring to FIG. 1C, the redistribution layer 30 also includes a second dielectric layer 60 that covers the traces 50 but not the ball-pads 40. A number of solder bumps or solder balls 70 are attached to the ball-pads 40. The redistribution layer 30 accordingly provides arrays of ball-pads 40 that are spaced farther apart and have more surface area than the bond-pads 22 for attaching the dies to a printed circuit board, a flip-chip in package, or other applications.

The microelectronic device 10 shown in FIG. 1C is manufactured by fabricating the dies 20 in the substrate 12, forming the bond-pads 22 on the dies 20, and then forming the redistribution layer 30. The redistribution layer 30 is formed by depositing the first dielectric layer 32 over the dies 20 and then etching holes in the first dielectric layer 32 over the bond-pads 22. The ball-pads 40 and traces 50 are then formed by depositing a metal layer over the first dielectric layer 32 and etching the pattern of ball-pads 40 and traces 50 using photolithographic and etching techniques known in the art. After forming the traces 50, the second dielectric layer 60 is deposited over the first dielectric layer 32, and holes are etched in the second dielectric layer 60 to expose the ball-pads 40. The solder balls 70 are formed on the ball-pads 40 using stencil printing, wafer level ball-attach techniques, or other techniques for depositing or otherwise forming solder balls onto each of the individual ball-pads 40. The process can further include plating nickel or another suitable material onto the pads before stencil printing or otherwise attaching the solder balls.

The microelectronic workpiece 10 shown in FIG. 1C is suitable for final processing, including cutting the workpiece 10 into single packaged microelectronic devices, testing the devices, marking the devices, and shipping the devices. The individual microelectronic devices, however, may be damaged during such procedures. Therefore, even though the microelectronic workpiece 10 is suitable for final processing at the stage shown in FIG. 1C, it would be beneficial to provide more protection to reduce the potential of damaging the microelectronic devices in subsequent handling.

C. Microelectronic Workpieces with Protective Layers

Figure 2:
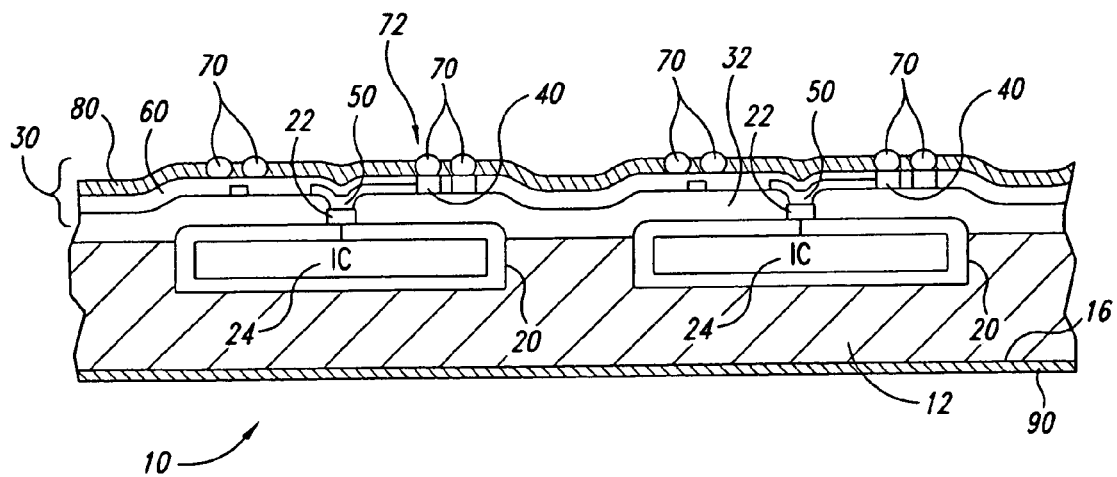
FIG. 2 is a schematic side cross-sectional view showing the portion of the workpiece of FIG. 1C at a subsequent stage of the method for forming microelectronic workpieces in accordance with the invention.

FIG. 2 is a schematic side cross-sectional view of a microelectronic workpiece 10 after a protective layer 90 has been applied to the backside 16 of the microelectronic workpiece 10. In this embodiment, a flowable protective material is applied to the backside 16 of the workpiece 10, and the material is then cured to form the protective layer 90. In some embodiments, a protective film 80 for the front side is applied to the redistribution layer 30 on the active side of the workpiece 10 in addition to applying the protective layer 90 to the backside 16. The protective film 80 protects the redistribution layer 30 and the dies 20 from being damaged in post-packaging handling.

The protective layer 90 on the backside 16 of the microelectronic workpiece 10 protects the workpiece 10 during post-packaging handling and throughout the life of the device. For example, the protective layer 90 protects the dies 20 from UV light and from edge chipping or cracking. The protective layer 90 also provides a good surface for laser marking the microelectronic workpiece 10 and the dies 20. The protective layer 90 is well suited for dissipating heat, and it also results in a thinner overall package than dies that are encapsulated in a molding compound at the die level. Finally, the protective layer 90 provides a packaged look on a bare die rather than having a bare silicon surface exposed on the backside.

The protective layer 90 can be applied to the backside 16 of the microelectronic workpiece 10 in a flowable state and then cured to a non-flowable state. The protective layer 90, for example, can be composed of a material that is flowable at ambient temperatures, such as approximately 25° C. The protective layer 90 is also preferably composed of a material that can be cured or otherwise hardened at temperatures above the application temperature. For example, the protective layer 90 can be composed of a material that cures to a hardened state in a relatively short period of time (e.g., 15-150 minutes) at elevated temperatures (e.g., approximately 50° C.-500° C.). In alternate embodiments, rapid thermal processing may be used to cure the flowable material to a non-flowable state.

Suitable materials for the protective layer 90 include polyimide, epoxy-based, and/or modified silicone materials. For example, commercially available products include 240-SB manufactured by Electro-Science Laboratories, T3084-A2A manufactured by Epoxy Technology, and HL-P200 manufactured by Hitachi Chemical. It will be appreciated that materials other than polyimide, epoxy-based, and/or modified silicone materials may be used for the protective layer 90. As explained in more detail below, the protective layer 90 can be applied to the backside 16 of the microelectronic workpiece 10 using several different automated techniques that are cost-effective and quick.

D. Embodiments of Applying Protective Layers to Workpieces

Figure 3A:
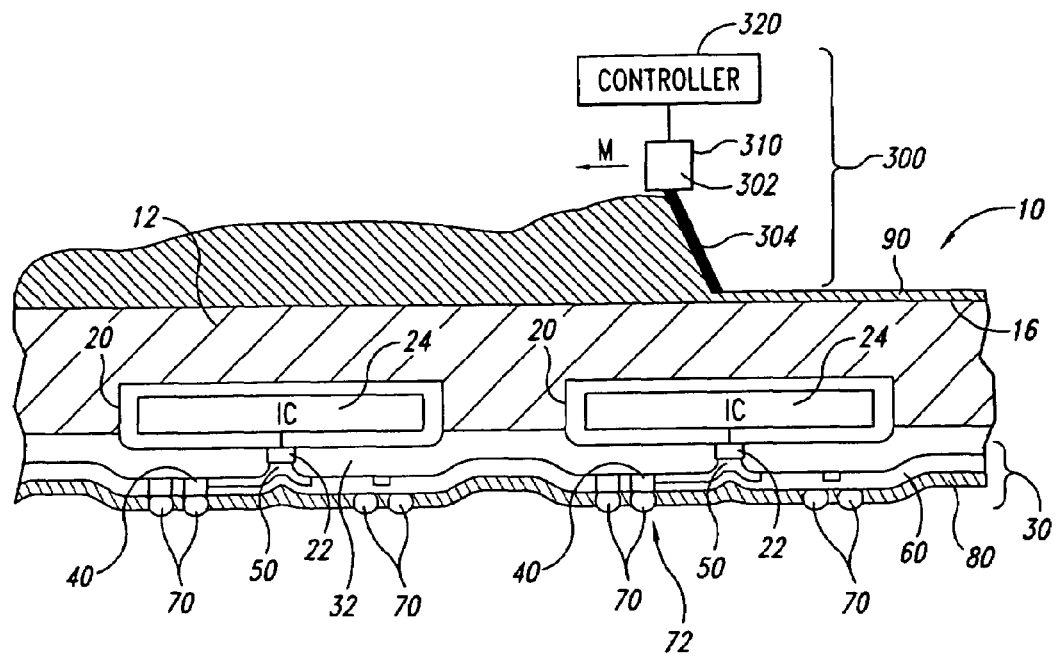
FIG. 3A is a schematic side cross-sectional view illustrating a workpiece at a stage of an embodiment of a method in accordance with the invention.
Figure 3B:
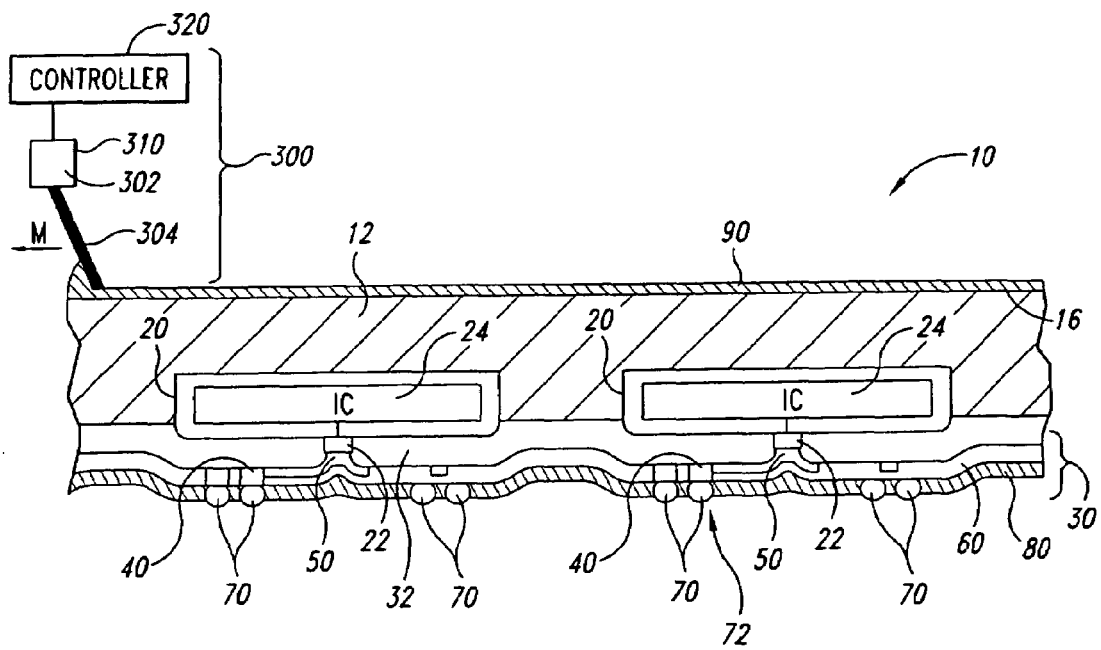
FIG. 3B is a schematic side cross-sectional view showing a workpiece at another stage of manufacturing workpieces in accordance with the invention.

FIGS. 3A-3B illustrate various stages in a method of applying a protective layer 90 to a workpiece 10 in accordance with one embodiment of the invention. FIG. 3A, more specifically, is a schematic side cross-sectional view of a stencil printing process for forming the protective layer 90 on the backside 16 of the workpiece 10 using a stencil printing apparatus 300. The stenciling apparatus 300 in the illustrated embodiment includes a wiper assembly 310 and a controller 320 operatively coupled to the wiper assembly 310. The wiper assembly 310 can include an actuator 302 and a wiper blade 304 coupled to the actuator 302. In the illustrated embodiment, the actuator 302 moves the wiper blade 304 across a stencil (not shown) over the backside 16 of the workpiece 10 in a direction M. The stencil (not shown) spaces the wiper blade 304 apart from the workpiece 10 by a small gap so that a thin film of the flowable protective material coats the backside 16 of the microelectronic workpiece 10 as the wiper blade 304 sweeps the flowable protective material in the direction M. The thickness of the stencil controls the thickness of the film on the backside 16. Referring to FIG. 3B, the wiper assembly 310 continues to move the wiper blade 304 in the direction M to remove excess flowable protective material from the backside 16 of the workpiece 10. The coating of flowable protective material on the backside 16 of the workpiece 10 can then be cured or otherwise hardened at an elevated temperature to complete the protective layer 90.

In the embodiment shown in FIGS. 3A and 3B, a protective film 80 can be applied over the second dielectric layer 60 on the front side of the workpiece 10. The front side protective film 80 is optional and can be applied either before or after applying the protective layer 90 to the backside 16 of the workpiece 10. The protective film 80 accordingly protects the redistribution layer 30 of the microelectronic workpiece 10 from being damaged during post-packaging handling, including the application of the protective layer 90. In certain embodiments, the protective film 80 can be etched or planarized to expose the upper portions of the solder balls 70 for defining exposed contact sites. In alternate embodiments, the microelectronic workpiece 10 may be supported by an edge-grip system while applying the protective layer 90 to eliminate the need for the front side protective film 80.

FIGS. 4A-4D illustrate additional methods of applying a protective layer 90 to a microelectronic workpiece 10 in accordance with other embodiments of the invention. FIG.

4A, more specifically, is a schematic side cross-sectional view of the workpiece 10 that is similar to FIG. 3A described above. In this embodiment, a flowable protective material can be sprayed onto the backside 16 of the workpiece 10 and then cured or otherwise hardened to form the protective layer 90. In one embodiment, a sprayer assembly 400 applies the flowable protective material onto the backside 16 of the workpiece 10. The sprayer assembly 400 includes a controller 410 and a nozzle assembly 402. In operation, the flowable protective material is sprayed from the nozzle assembly 402 as the workpiece 10 moves in the direction $M_2$ beneath the sprayer assembly 400 until the flowable material has been applied over a desired portion of the backside 16 of the workpiece 10. In other embodiments, the workpiece 10 can move in a variety of directions under the sprayer assembly 400.

Figure 4A:
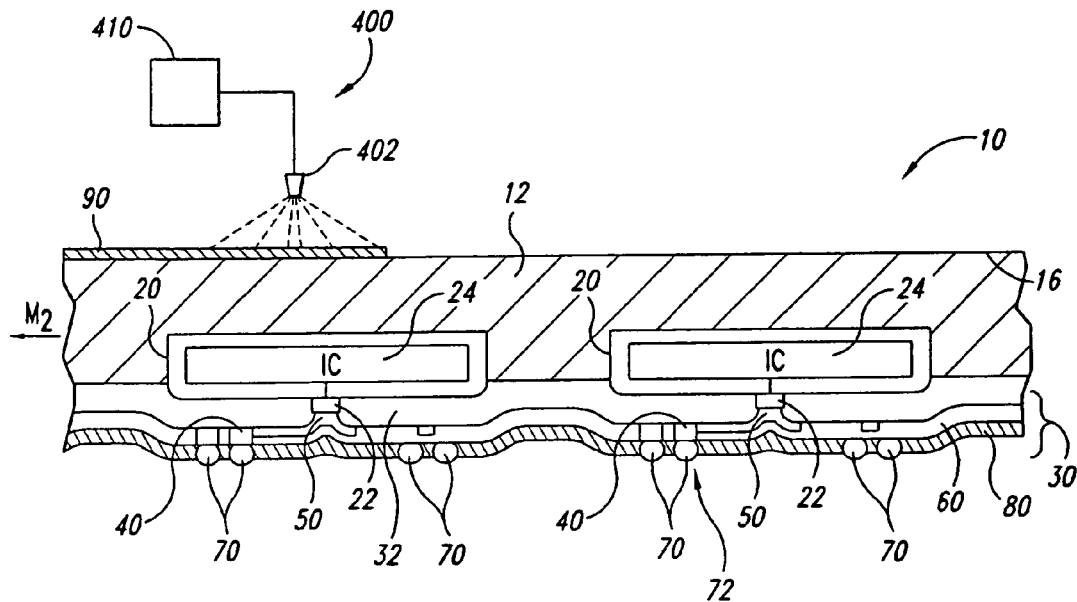
FIG. 4A is a schematic side cross-sectional view illustrating a workpiece at a stage of another embodiment of a method in accordance with the invention.
Figure 4B:
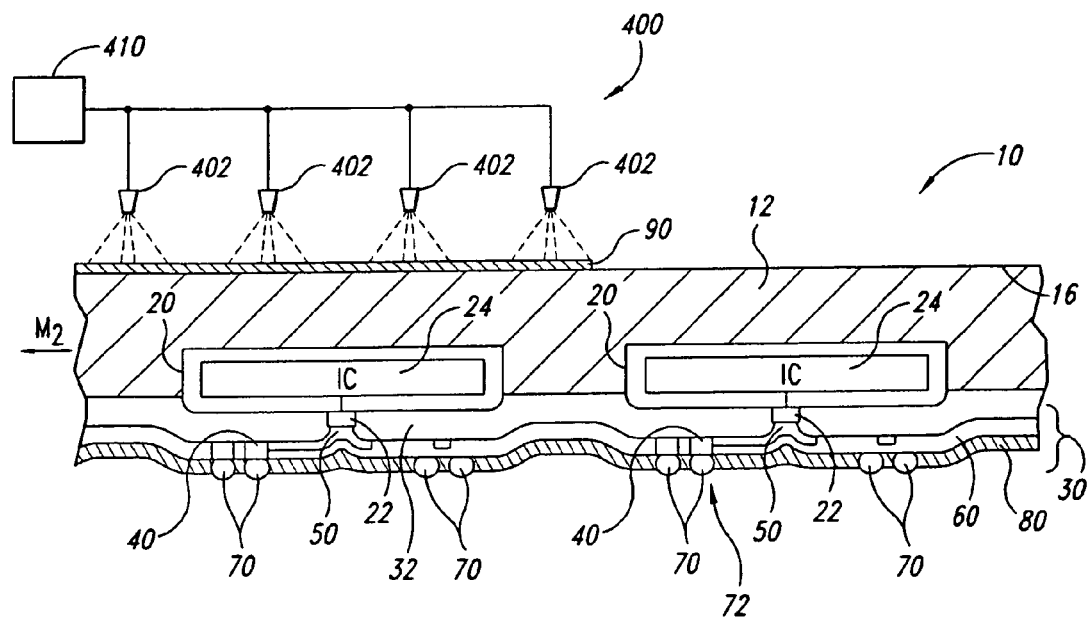
FIG. 4B is a schematic side cross-sectional view illustrating a workpiece at another stage of an embodiment of a method in accordance with the invention.

FIGS. 4B-4D illustrate alternate embodiments using the sprayer assembly 400 to apply the protective layer 90 to the backside 16 of the workpiece 10. As shown in FIG. 4B, a plurality of nozzle assemblies 402 may be used to spray the flowable protective material onto the backside 16 of the workpiece 10. In yet another embodiment illustrated in FIG. 4C, the workpiece 10 may be held stationary by edge grips 420 while the sprayer assembly 400 moves in the direction $M_3$ across the backside 16 of the workpiece 10 to apply the flowable protective material. In this embodiment, the workpiece 10 may be inverted, such that the sprayer assembly 400 is positioned above the backside 16 of the workpiece 10. Referring now to FIG. 4D, another embodiment is shown where the workpiece 10 may be oriented such that the backside 16 is facing downward and the sprayer assembly 400 is positioned below the workpiece 10 with the nozzle assembly 402 oriented upward toward the backside 16 of the workpiece 10.

Figure 5:
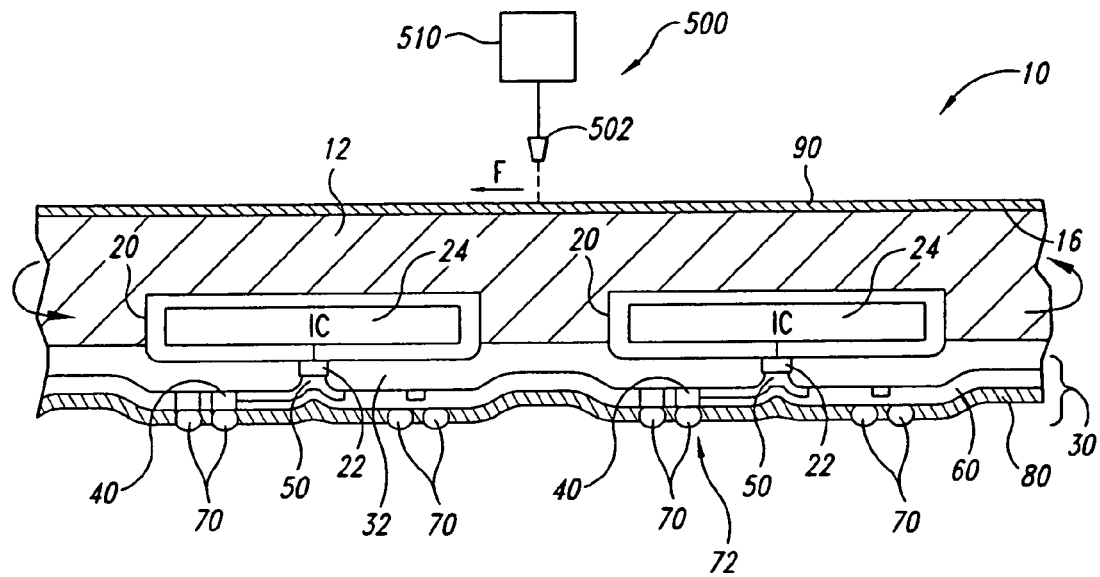
FIG. 5 is a schematic side cross-sectional view illustrating a workpiece at a stage of another embodiment of a method in accordance with the invention.

FIG. 5 is a schematic side cross-sectional view of the workpiece 10 illustrating another embodiment of applying the protective layer 90 to the backside 16 of the workpiece 10. In this embodiment, the protective layer 90 can be applied using spin coating assembly 500 placed above the backside 16 of the workpiece 10. The spin coating assembly 500 includes a controller 510 and a dispenser 502. The flowable protective material flows through the dispenser 502 onto a control area of the backside 16 of the workpiece 10 as the workpiece rotates. The rotation of the workpiece 10 causes the flowable protective material to spread outwardly in the direction F across the backside 16 of the workpiece 10 in a uniform manner. Suitable spin coating equipment and techniques are known in the art of depositing resist or dielectric materials on semiconductor wafers.

Figure 6A:
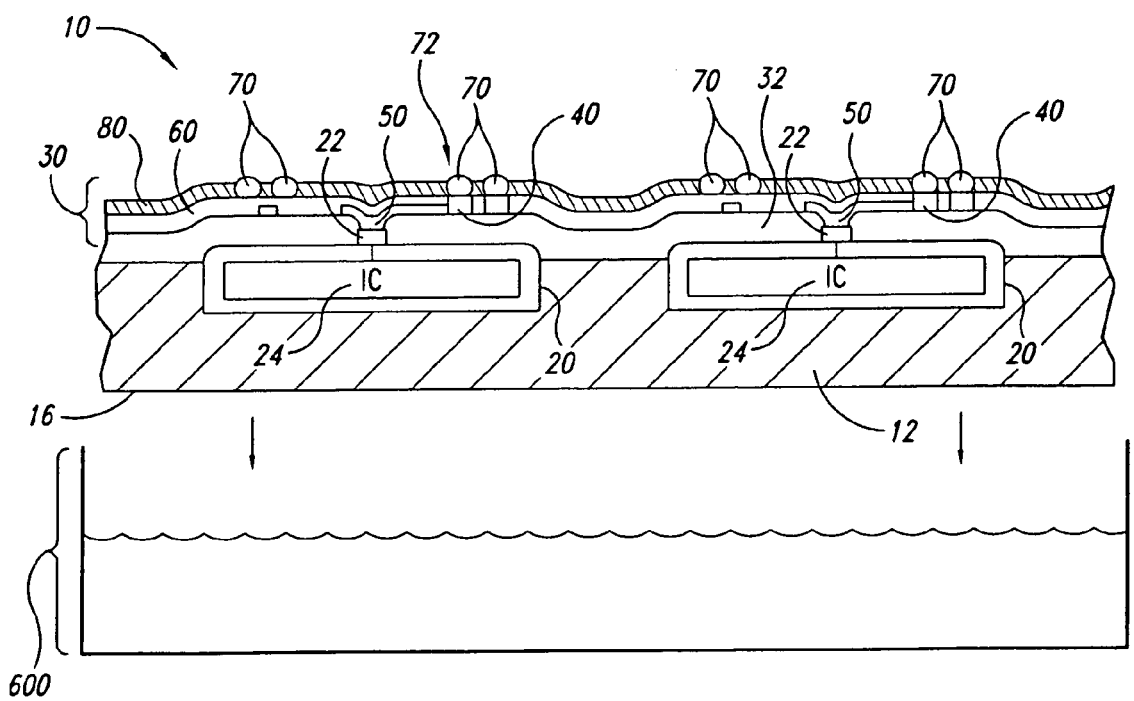
FIG. 6A is a schematic side cross-sectional view illustrating a workpiece at a stage of another embodiment of a method in accordance with the invention.
Figure 6B:
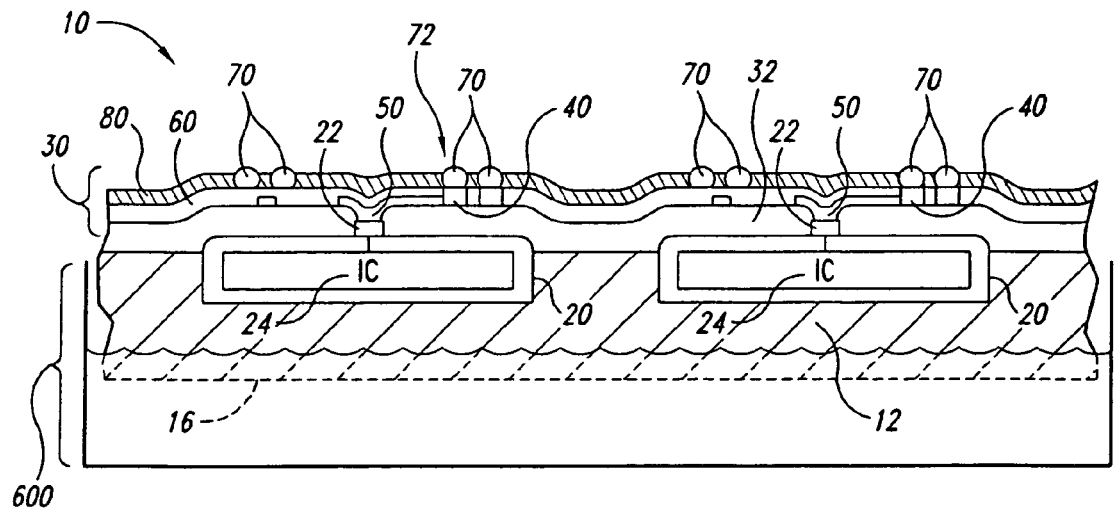
FIG. 6B is a schematic side cross-sectional view illustrating a workpiece at another stage of an embodiment of a method in accordance with the invention.
Figure 6C:
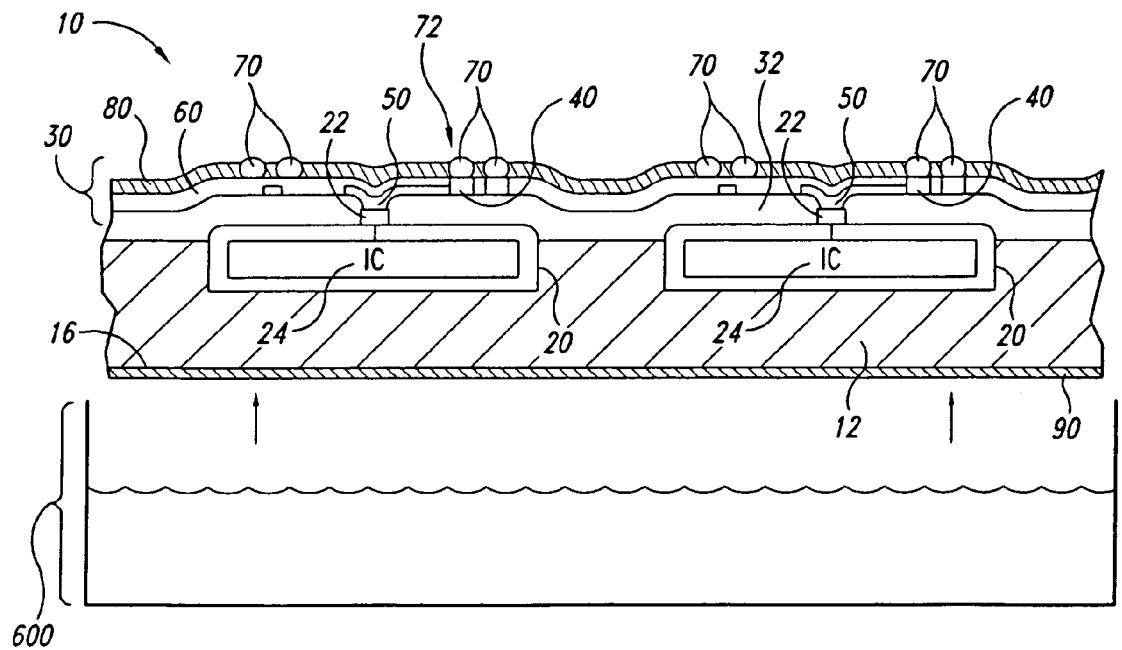
FIG. 6C is a schematic side cross-sectional view illustrating a workpiece at another stage of an embodiment of a method in accordance with the invention.

FIGS. 6A-6C are schematic side cross-sectional views of the workpiece 10 illustrating another embodiment of applying the protective layer 90 to the backside 16 of the workpiece 10. In this embodiment, the protective layer 90 can be applied using a dip bath 600. Referring to FIG. 6A, the workpiece 10 is positioned above the dip bath 600 and prepared for the application of the protective layer 90. Referring next to FIG. 6B, the backside 16 of the workpiece 10 is placed in the dip bath 600 such that the flowable protective material is applied to the workpiece and forms the protective layer 90. Referring next to FIG. 6C, after application of the flowable protective material in the dip bath 600, the workpiece 10 is removed from the dip bath to form the protective layer 90 on the backside 16 of the workpiece 10.

The foregoing methods for forming the protective layer 90 described above with respect to FIGS. 3A-6C illustrate several methods for applying the flowable protective material to the backside of the microelectronic workpiece before curing or otherwise hardening the material to form the protective layer. In other embodiments, other methods than those disclosed herein can be used to apply the flowable protective material to the backside of the workpiece. Accordingly, the present invention is not limited to the particular application methods described above, but extends to other methods for providing a protective layer to the backside of a microelectronic workpiece without departing from the spirit or scope of the present invention.

Figure 7:
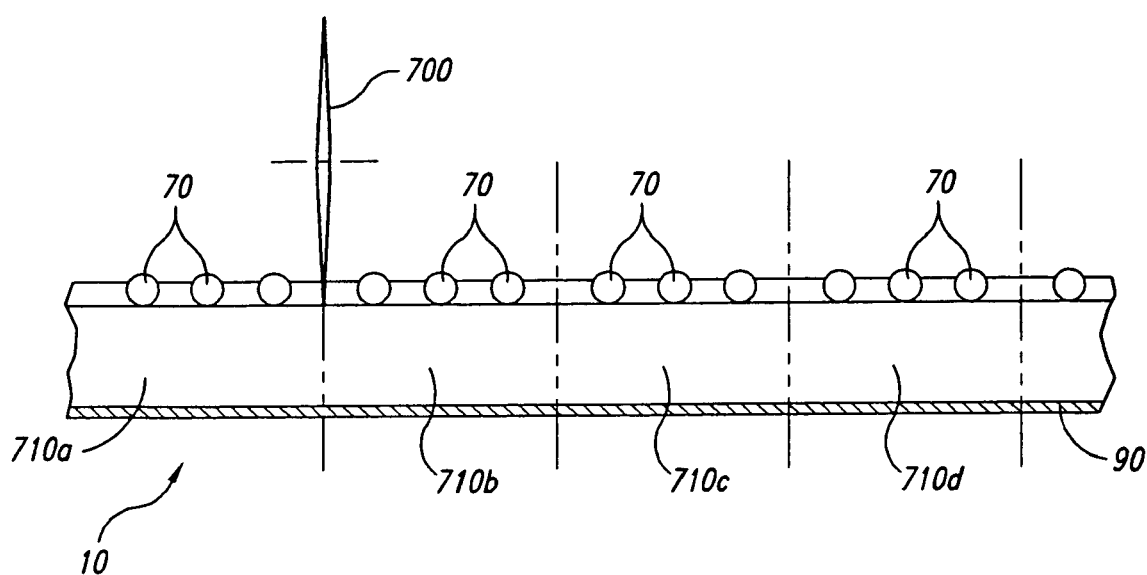
FIG. 7 is a schematic side view illustrating a workpiece at a stage in another embodiment of a method for forming microelectronic workpieces in accordance with the invention.

FIG. 7 is a schematic side elevation view of a subsequent process for forming individual microelectronic devices from the workpiece 10 after the protective layer 90 has been applied and cured. In this process, a cutter 700 cuts the workpiece 10 along the scribe lanes to separate the individual microelectronic devices 710a-d from each other. This process is typically known as "dicing" or "singulation," and it can be performed after curing the protective layer 90 to a hardened state at an elevated temperature for a period of time.

Several embodiments of the microelectronic workpieces are expected to provide microelectronic devices that are less susceptible to damage caused by post-packaging handling. The protective layer provides an effective substitute for the manually applied tape previously used for wafer backside protection. Additionally, the protective layer in the embodiments described above can be applied using automated equipment and processes without the use of manual labor.

From the foregoing, it will be appreciated that specific embodiments of the invention have been described herein for purposes of illustration, but that various modifications may be made without deviating from the spirit and scope of the invention. Accordingly, the invention is not limited, except as by the appended claims.

I claim:

1. A method for processing a microelectronic device, comprising:
    fabricating a plurality of dies at an active side of a microelectronic workpiece, the dies having integrated circuitry and bond-pads coupled to the integrated circuitry;
    constructing a redistribution assembly at the active side of the workpiece before separating the dies by depositing a dielectric layer over the dies and forming conductive elements having traces connected to corresponding bond-pads on the dies and ball-pads arranged in ball-pad arrays;
    covering a backside of the workpiece with a protective material in a flowable state before separating the dies; and
    curing the protective material to create a protective layer on the backside of the workpiece.

2. The method of claim 1, further comprising:
    attaching a plurality of solder balls to the ball-pads; and
    covering the dielectric layer with an active side protective film that surrounds at least a portion of the solder balls.

3. The method of claim 1 wherein covering the backside of the workpiece comprises stencil printing the material onto the backside of the workpiece.

4. The method of claim 1 wherein covering the backside of the workpiece comprises spraying the material onto the backside of the workpiece.

5. The method of claim 1 wherein covering the backside of the workpiece comprises spin coating the material onto the backside of the workpiece.

6. The method of claim 1 wherein covering the backside of the workpiece comprises applying the material onto the backside of the workpiece in a dip bath.

7. The method of claim 1 wherein curing the material comprises heating the material in an environment at a temperature of approximately 50° C. to 500° C. for approximately 15-150 minutes.

8. The method of claim 1 wherein curing the material comprises heating the material in an environment at a temperature of approximately 150° C. to 250° C. for approximately 15-120 minutes.

9. The method of claim 1 wherein curing the material comprises heating the material in an environment at a temperature of approximately 150° C. for approximately 120 minutes.

10. The method of claim 1 wherein curing the material comprises heating the material in an environment at a temperature of approximately 200° C. for approximately 15 minutes.

11. The method of claim 1 wherein curing the material comprises heating the material in an environment at a temperature of approximately 250° C. for approximately 60 minutes.

12. The method of claim 1 wherein the material is a polyimide, epoxy-based, and/or modified silicone material.

13. A method for protecting a microelectronic device, the method comprising:
providing a microelectronic workpiece having an active side, a backside, and a plurality of dies at the active side of the workpiece, wherein the dies include integrated circuitry and bond-pads coupled to the integrated circuitry;
providing a redistribution assembly at the active side of the workpiece, the redistribution assembly having a dielectric layer over the dies, ball-pads arranged in ball-pad arrays corresponding to the dies, and traces coupling the bond-pads of a die to the ball-pads of a corresponding ball-pad array;
covering the backside of the workpiece with a coating of protective material in a flowable state before separating the dies;
changing the protective material to a non-flowable state;
attaching a plurality of solder balls to the ball-pads; and
covering the dielectric layer with a protective film that surrounds at least a portion of the solder balls.

14. The method of claim 13 wherein covering the backside of the workpiece comprises stencil printing the material onto the backside of the workpiece.

15. The method of claim 13 wherein covering the backside of the workpiece comprises spraying the material onto the backside of the workpiece.

16. The method of claim 13 wherein covering the backside of the workpiece comprises spin coating the material onto the backside of the workpiece.

17. The method of claim 13 wherein covering the backside of the workpiece comprises applying the material onto the backside of the workpiece in a dip bath.

18. The method of claim 13 wherein changing the protective material to a non-flowable state comprises curing the material by heating the material in an environment at a temperature of approximately 50° C. to 500° C. for approximately 15-150 minutes.

19. The method of claim 13 wherein changing the protective material to a non-flowable state comprises curing the material by heating the material in an environment at a temperature of approximately 150° C. to 250° C. for approximately 15-120 minutes.

20. The method of claim 13 wherein changing the protective material to a non-flowable state comprises curing the material by heating the material in an environment at a temperature of approximately 150° C. for approximately 120 minutes.

21. The method of claim 13 wherein changing the protective material to a non-flowable state comprises curing the material by heating the material in an environment at a temperature of approximately 200° C. for approximately 15 minutes.

22. The method of claim 13 wherein changing the protective material to a non-flowable state comprises curing the material by heating the material in an environment at a temperature of approximately 250° C. for approximately 60 minutes.

23. The method of claim 13 wherein changing the protective material to a non-flowable state comprises curing the material using rapid thermal processing.

24. The method of claim 13 wherein the material is a polyimide, epoxy-based, and/or modified silicone material.

25. A method for fabricating a microelectronic device, comprising:
providing a microelectronic workpiece having an active side and a backside, the microelectronic workpiece having a plurality of dies at the active side, the dies including integrated circuitry and bond-pads coupled to the integrated circuitry;
fabricating a redistribution layer before separating the dies from each other, the redistribution layer having a dielectric layer over the dies, ball-pads arranged in ball-pad arrays corresponding to the dies, and traces coupling the bond-pads of a die to the ball-pads of a corresponding ball-pad array;
covering the backside of the workpiece with a protective material in a flowable state before separating the dies from each other; and
curing the protective material to create a protective layer on the backside of the workpiece.

26. The method of claim 25, further comprising:
attaching a plurality of solder balls to the ball-pads; and
covering the dielectric layer with a protective film that surrounds at least a portion of the solder balls.

27. The method of claim 25 wherein covering the backside of the workpiece comprises stencil printing the material onto the backside of the workpiece.

28. The method of claim 25 wherein covering the backside of the workpiece comprises spraying the material onto the backside of the workpiece.

29. The method of claim 25 wherein covering the backside of the workpiece comprises spin coating the material onto the backside of the workpiece.

30. The method of claim 25 wherein covering the backside of the workpiece comprises applying the material onto the backside of the workpiece in a dip bath.

31. The method of claim 25 wherein curing the material comprises heating the material in an environment at a temperature of approximately 50° C. to 500° C. for approximately 15-150 minutes.

32. The method of claim 25 wherein curing the material comprises heating the material in an environment at a temperature of approximately 150° C. to 250° C. for approximately 15-120 minutes.

33. The method of claim 25 wherein curing the material comprises heating the material in an environment at a temperature of approximately 150° C. for approximately 120 minutes.

34. The method of claim 25 wherein curing the material comprises heating the material in an environment at a temperature of approximately 200° C. for approximately 15 minutes.

35. The method of claim 25 wherein curing the material comprises heating the material in an environment at a temperature of approximately 250° C. for approximately 60 minutes.

36. The method of claim 25 wherein curing the material comprises changing the material from a flowable state to a non-flowable state using rapid thermal processing.

37. The method of claim 25 wherein the material is a polyimide, epoxy-based, and/or modified silicone material.

* * * * *